US008659129B2

(12) United States Patent
Shinkai

(10) Patent No.: US 8,659,129 B2
(45) Date of Patent: Feb. 25, 2014

(54) SEMICONDUCTOR DEVICE AND METHOD OF MANUFACTURING SAME

(75) Inventor: Jiro Shinkai, Osaka (JP)

(73) Assignee: Sumitomo Electric Industries, Ltd., Osaka-shi (JP)

(*) Notice: Subject to any disclaimer, the term of this patent is extended or adjusted under 35 U.S.C. 154(b) by 0 days.

(21) Appl. No.: 13/420,331

(22) Filed: Mar. 14, 2012

(65) Prior Publication Data
US 2012/0235288 A1 Sep. 20, 2012

Related U.S. Application Data

(60) Provisional application No. 61/453,716, filed on Mar. 17, 2011.

(30) Foreign Application Priority Data

Mar. 17, 2011 (JP) ................. P2011-059339

(51) Int. Cl.
H01L 23/495 (2006.01)
(52) U.S. Cl.
USPC ........... 257/670; 257/666; 257/678; 257/692; 257/790; 257/E23.056; 257/E23.116; 257/E23.126; 257/E23.129; 438/124; 438/127
(58) Field of Classification Search
None
See application file for complete search history.

(56) References Cited

U.S. PATENT DOCUMENTS

2004/0084758 A1* 5/2004 Chuang et al. ................. 257/673
2005/0082646 A1* 4/2005 Komoto et al. ............... 257/666

FOREIGN PATENT DOCUMENTS

| JP | 05-226396 A | 9/1993 |
| JP | 09-116045 A | 5/1997 |
| JP | 09-275178 A | 10/1997 |
| JP | 2000-012583 A | 1/2000 |
| JP | 2001-320006 A | 11/2001 |

OTHER PUBLICATIONS

International Preliminary Report on Patentability and Written Opinion in PCT International Application No. PCT/JP2011/080328, dated Sep. 26, 2013.

* cited by examiner

Primary Examiner — Julio J Maldonado
Assistant Examiner — Molly Reida
(74) Attorney, Agent, or Firm — Venable LLP; Michael A. Sartori; Tamatane J. Aga

(57) ABSTRACT

A semiconductor device in accordance with an embodiment comprises a semiconductor chip; a die pad having a chip mount surface for mounting the semiconductor chip; first leads electrically connected to the semiconductor chip; a thermosetting resin part for securing end parts of the first leads to the die pad; and a thermoplastic resin part for sealing the semiconductor chip, the die pad, and the thermosetting resin part.

13 Claims, 8 Drawing Sheets

SEMICONDUCTOR DEVICE AND METHOD OF MANUFACTURING SAME

RELATED APPLICATIONS

This application claims priority to Provisional Application Ser. No. 61/453,716 filed on Mar. 17, 2011 and claims the benefit of Japanese Patent Application No. 2011-059339, filed Mar. 17, 2011, all of which are incorporated herein by reference in their entirety.

BACKGROUND OF THE INVENTION

1. Field of the Invention

The present invention relates to a semiconductor device and a method of manufacturing the same.

2. Related Background Art

As an example of semiconductor devices, resin-sealed semiconductor devices have been known. In a resin-sealed semiconductor device, a semiconductor chip is mounted to a die pad of a lead frame, while the semiconductor chip and die pad are molded with a resin. The lead frame is equipped with leads to be wire-bonded to the semiconductor chip, while an end part of such a lead on the side connecting with the semiconductor chip is molded with the resin together with the semiconductor chip. The resin used for the molding is a thermoplastic resin such as a polyphenylene sulfide (PPS) resin as illustrated in Japanese Patent Application Laid-Open No. 5-226396 and Japanese Patent Application Laid-Open No. 2000-12583.

SUMMARY OF THE INVENTION

In the prior art, leads which are electrically connected to a semiconductor chip by wire bonding are secured to a die pad with a thermoplastic resin. Therefore, local heating to a lead by a soldering iron or the like, if any, at the time of securing the semiconductor device to other members such as a circuit board may soften the thermoplastic resin, thereby causing the lead to drop out of its sealing part constituted by the thermoplastic resin.

It is an object of the present invention to provide a semiconductor device from which leads are harder to drop out even when heated and a method of manufacturing the same.

The semiconductor device in accordance with one aspect of the present invention comprises a semiconductor chip; a die pad having a chip mount surface for mounting the semiconductor chip; a first lead having an end part electrically connected to the semiconductor chip; a thermosetting resin part for securing the end part of the first lead to the die pad; and a thermoplastic resin part for sealing the semiconductor chip, the die pad, and the thermosetting resin part.

In this mode, the first lead is secured to the die pad by the thermosetting resin part and thus is hard to drop out of the thermoplastic resin part even when heated.

In one embodiment, the thermosetting resin part may overlap a part of a region on the first lead side of at least one of the chip mount surface and side faces of the die pad. This can secure the thermosetting resin part to the die pad more reliably.

In one embodiment, the thermoplastic resin part may cover the thermosetting resin part. This improves the adhesion between the thermoplastic and thermosetting resin parts, thereby making it harder for the thermosetting resin part to drop out of the thermoplastic resin part.

In one embodiment, a part of the region of the die pad overlapping the thermosetting resin part may be formed with at least one of a depression and a projection. At least one of the depression and projection can secure the thermosetting resin part to the die pad more firmly.

In one embodiment, the semiconductor device may further comprise a second lead integrally joined to the die pad.

In one embodiment, a surface of the die pad opposite to the chip mount surface may be free of the thermosetting and thermoplastic resin parts. This allows the surface of the die pad opposite to the chip mount surface to function as a heat dissipation surface.

Another aspect of the present invention relates to a method of manufacturing a semiconductor device. The method of manufacturing a semiconductor device comprises the steps of mounting a semiconductor chip to a chip mount surface of a die pad; electrically connecting the semiconductor chip and an end part of a first lead to each other; securing the end part of the first lead to the die pad with a thermosetting resin; and sealing the thermosetting resin, the semiconductor chip, and the die pad with a thermoplastic resin.

In this method, the first lead is secured to the die pad with the thermosetting resin. Therefore, the first lead is harder to drop out of the part sealed with the thermoplastic resin even when heated.

As mentioned above, a semiconductor device from which leads are harder to drop out even when heated and a method of manufacturing the same can be provided.

DESCRIPTION OF THE PREFERRED EMBODIMENTS

Figure 1:
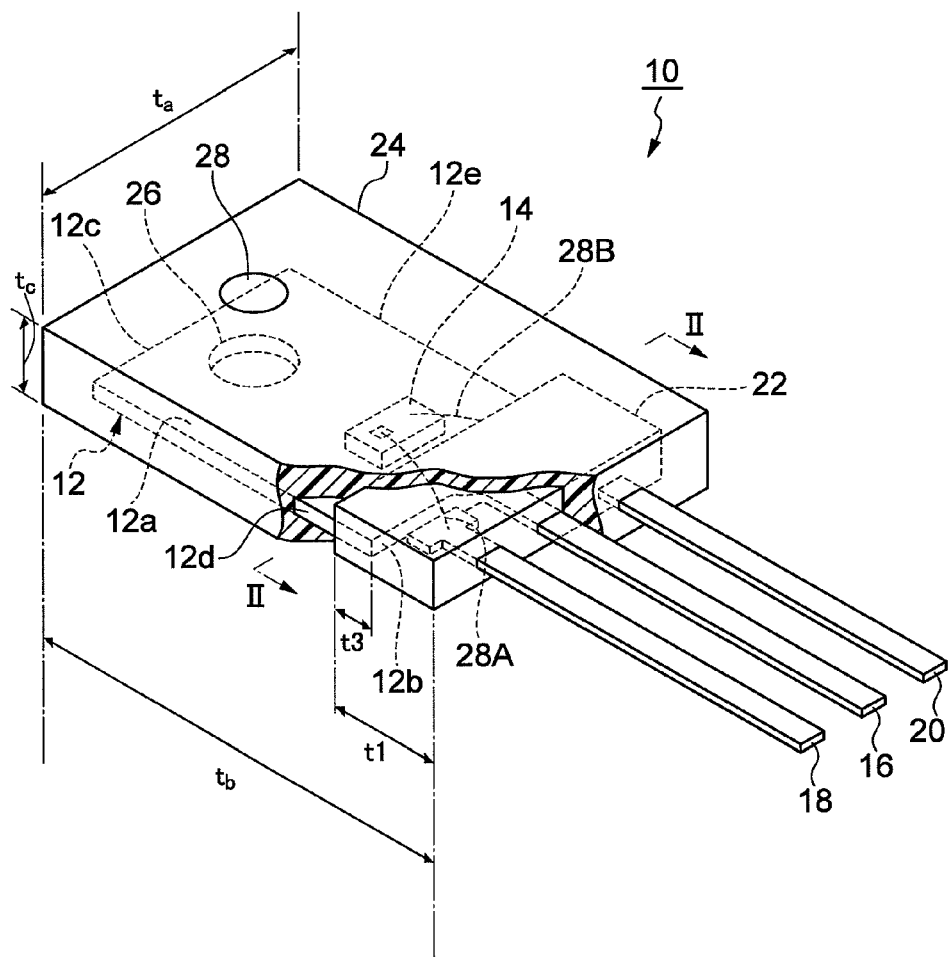
FIG. 1 is a perspective view of the semiconductor device in accordance with an embodiment of the present invention.

In the following, embodiments of the present invention will be explained with reference to the drawings. In the explanation of the drawings, the same constituents will be referred to with the same signs while omitting their overlapping descriptions. Proportions in the drawings do not always coincide with those explained.

Figure 2:
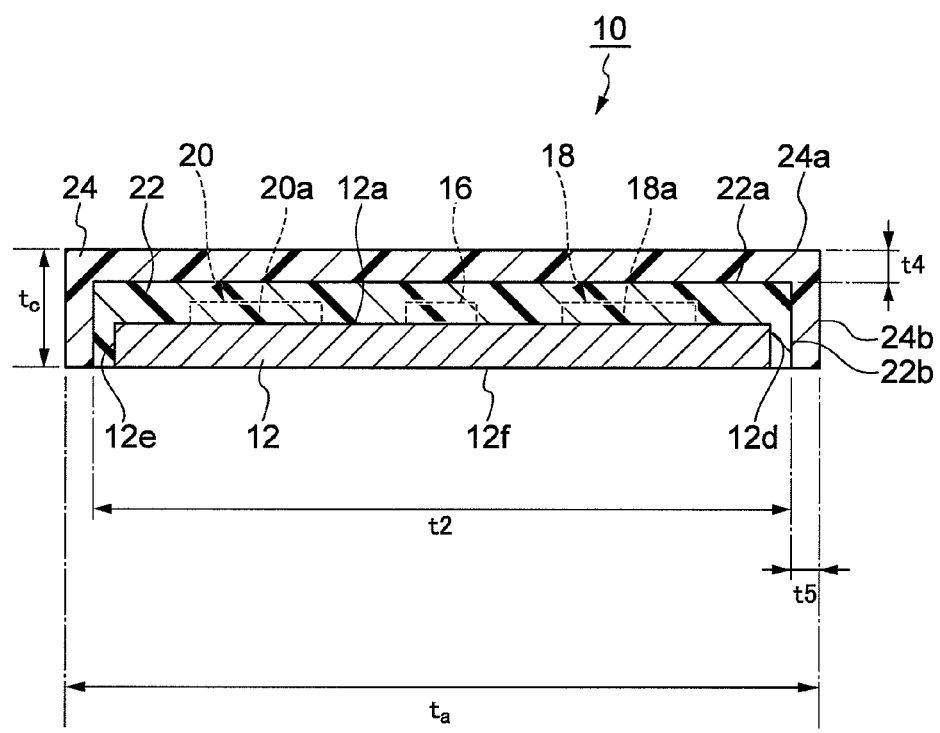
FIG. 2 is a sectional view taken along the line of FIG. 1.

With reference to FIGS. 1 and 2, the semiconductor device in accordance with an embodiment will be explained. FIG. 1 is a perspective view of the semiconductor device in accordance with the embodiment. FIG. 2 is a sectional view taken along the line II-II of FIG. 1. For convenience of explanation, FIG. 1 cuts away a part of the semiconductor device.

This semiconductor device 10 is a resin-sealed semiconductor device. As illustrated in FIGS. 1 and 2, the semiconductor device 10 comprises a die pad 12, a semiconductor chip 14, three leads 16, 18, 20, a thermosetting resin part 22, and a thermoplastic resin part 24. Examples of package of the resin-sealed semiconductor device 10 are common TO series. Examples of the TO series include TO-247, TO-220, TO-263 (D2-PAK), and TO-252 (D-PAK).

The die pad 12 has a sheet form. An example of the form of the die pad 12 seen as a plane is oblong as illustrated in FIGS. 1 and 2. An example of materials constituting the die pad 12 includes copper. The die pad 12 is formed with a through hole 26 penetrating therethrough in the thickness direction. The through hole 26 is a hole for passing a screw therethrough when securing the semiconductor device 10 to other members and the like by screwing, for example. The die pad 12 has a chip mount surface 12a for mounting the semiconductor chip 14.

The semiconductor chip 14 is mounted at a predetermined position of the chip mount surface 12a. Examples of the semiconductor chip 14 include MOS-FET and diodes. The semiconductor chip 14 can be mounted to the chip mount surface 12a as being bonded thereto with a lead-containing metal solder, a lead-free metal solder, or a conductive resin.

The three leads 16, 18, 20 construct a lead frame together with the die pad 12. Among the three leads 16, 18, 20, the center lead (second lead) 16 is mechanically (i.e., physically) integrally joined to an end part of the die pad 12. Since the die pad 12 is conductive, the lead 16 and die pad 12 are electrically connected to each other. Since the semiconductor chip 14 is bonded to the chip mount surface 12a of the conductive die pad 12 with the metal solder or the like exemplified above, the lead 16 and semiconductor chip 14 are electrically connected to each other. Examples of materials for the lead 16 include those for the die pad 12. The die pad 12 having the lead 16 joined thereto is only required to be made such that the lead 16 is directly mechanically joined to the die pad 12 and can be produced, for example, by integrally shaping a conductive sheet material such as a metal sheet through pressing.

The leads (first leads) 18, 20 on both sides of the lead 16 are electrically connected to the semiconductor chip 14 through wires 28A, 28B serving as connection lines, respectively. Examples of the wires 28A, 28B include aluminum lines, aluminum ribbons, gold lines, gold ribbons, and copper lines. Examples of materials for the leads 18, 20 include copper (Cu) and Cu alloys. When the semiconductor chip 14 is a MOS-FET, the lead 16, one of the leads 18, 20, and the other of the leads 18, 20 correspond to drain, source, and gate terminals, respectively. The leads 18, 20 are secured to the die pad 12 with the thermosetting resin part 22.

The thermosetting resin part 22 incorporates end parts 18a, 20a (see FIG. 2) of the leads 18, 20 to which respective one ends of the wires 28A, 28B are connected. The thermosetting resin part 22 can be formed by transfer molding, for example. Examples of thermosetting resins constituting the thermosetting resin part 22 include epoxy resins. An example of outer forms of the thermosetting resin part 22 is substantially a rectangular parallelepiped as illustrated in FIG. 1. An example of length t1 in the shorter side direction of the thermosetting resin part 22 illustrated in FIG. 1 is 2.5 to 3.0 mm, while an example of length t2 (see FIG. 2) in the longer side direction thereof is 17.5 to 18.0 mm.

In the embodiment, the thermosetting resin part 22 may cover an end part of the die pad 12. In other words, a portion of the die pad 12 on the side of the leads 16, 18, 20 which extends by a predetermined length t3 from a side face 12b toward a side face 12c is embedded in the thermosetting resin part 22. In this case, the thermosetting resin part 22 overlaps a part of regions on the side face 12b side of side faces 12d, 12e of the die pad 12 and the chip mount surface 12a as well as the side face 12b. An example of the predetermined length t3 is 0.5 to 1.5 mm, more specifically 0.5 mm.

The thermoplastic resin part 24 seals the semiconductor chip 14, die pad 12, and thermosetting resin part 22. Parts of the leads 16, 18, on the inside of the thermoplastic resin part 24 are so-called inner lead parts, while their parts on the outside are outer lead parts. An example of outer forms of the thermoplastic resin part 24 is substantially a rectangular parallelepiped as illustrated in FIG. 1. In this case, an example of outer dimensions of the thermoplastic resin part 24 is 20.0 mm (length of $t_a$ in FIG. 1)×24.0 mm (length of $t_b$ in FIG. 1)×4.80 mm (length of $t_c$ in FIG. 1). Examples of thermoplastic resins constituting the thermoplastic resin part 24 include polyphenylene sulfide (PPS) resins and liquid crystal polymers. The thermoplastic resin part 24 can be formed by molding the semiconductor chip 14, die pad 12, and thermosetting resin part 22 with a thermoplastic resin. The thermoplastic resin part 24 is formed with a through hole 28 whose center axis is aligned with that of the through hole 26 of the die pad 12. As with the through hole 26, the through hole 28 is a hole for passing a screw therethrough at the time of screwing or the like. The through hole 28 has a diameter smaller than that of the through hole 26.

In the embodiment, the thermoplastic resin part 24 has an outer form greater than that of the thermosetting resin part 22 in the thickness and width directions of the die pad 12. In this case, the thermoplastic resin part 24 covers the thermosetting resin part 22. This structure brings surfaces 22a, 22b and the like of the thermosetting resin part 22 into more reliable contact with the thermoplastic resin, thereby further improving the adhesion between the thermosetting and thermoplastic resin parts 22, 24. In a direction (thickness direction) normal to the chip mount surface 12a, an example of distance t4 between a surface 24a of the thermoplastic resin part 24 and the surface 22a of the thermosetting resin part 22 is 0.5 to 1.5 mm, more specifically 0.5 mm. Similarly, in a direction (width direction) normal to the side face 12d, an example of distance t5 between a side face 24b of the thermoplastic resin part 24 and the surface 22b of the thermosetting resin part 22 is 0.5 to 1.5 mm, more specifically 0.5 mm. The foregoing explanation on the side face 12d side also holds in a direction normal to the side face 12e.

In one embodiment, a bottom face 12f which is a surface opposite to the chip mount surface 12a of the die pad 12 can be free. In other words, the bottom face 12f may be a surface covered with none of the thermosetting resin part 22 and thermoplastic resins. In this case, the bottom face 12f can function as a heat dissipation surface.

Figure 3:
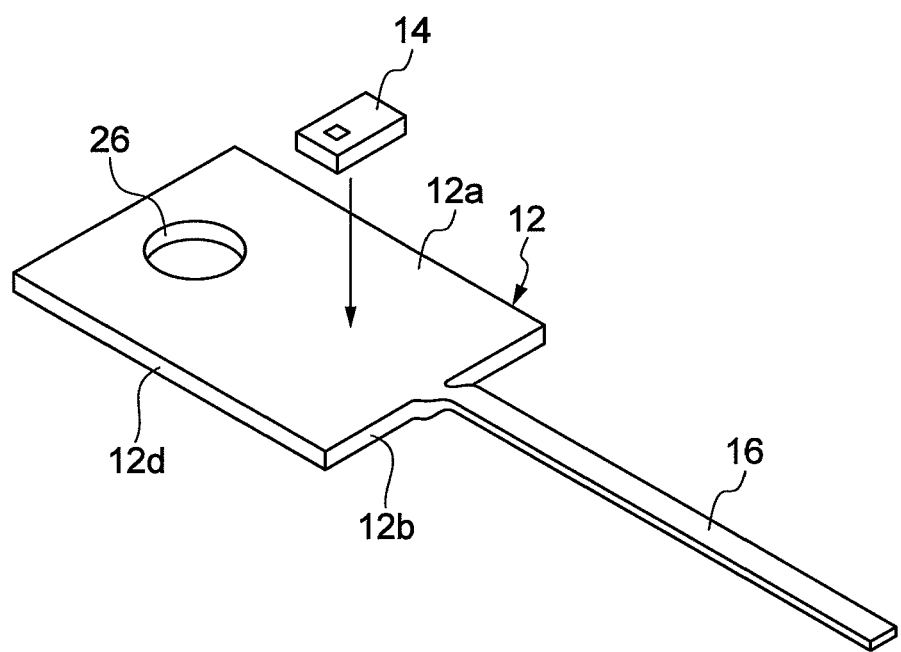
FIG. 3 is a diagram illustrating a step of a method of manufacturing the semiconductor device represented in FIG. 1.
Figure 4:
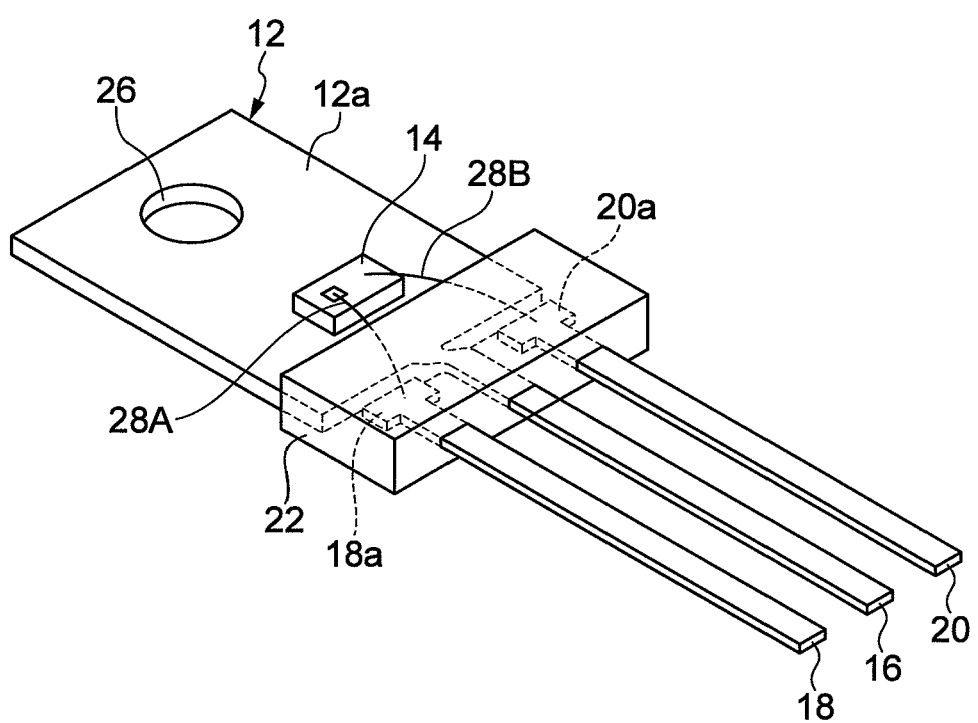
FIG. 4 is a diagram illustrating a step of the method of manufacturing the semiconductor device represented in FIG. 1.
Figure 5:
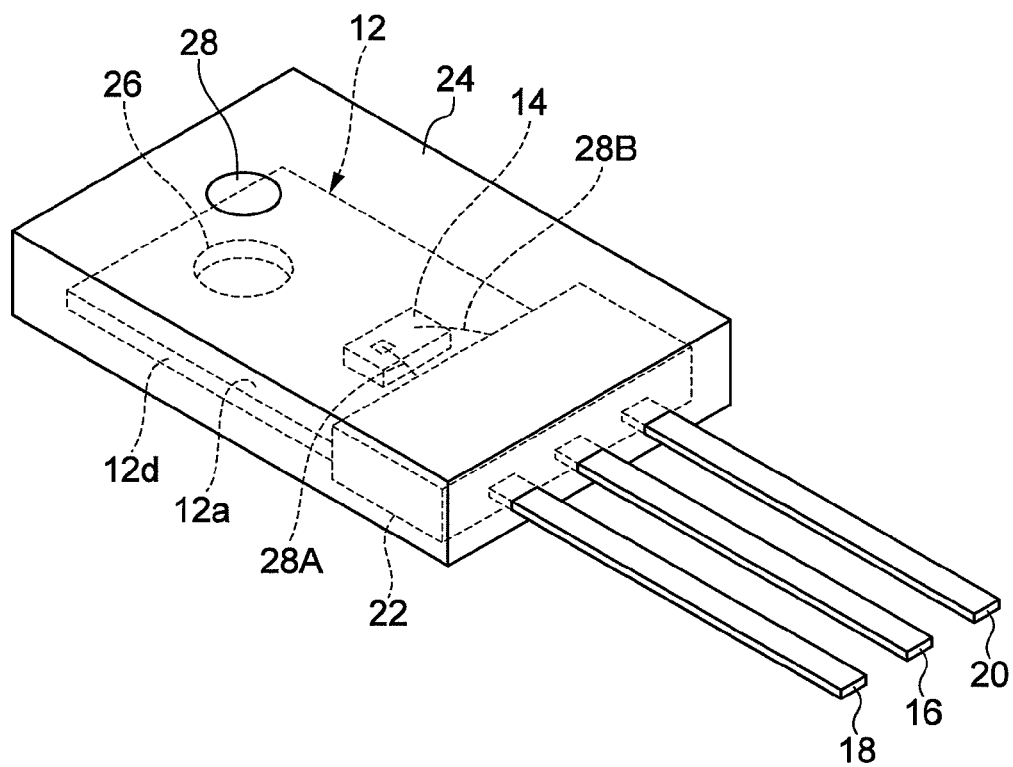
FIG. 5 is a diagram illustrating a step of the method of manufacturing the semiconductor device represented in FIG. 1.

With reference to FIGS. 3 to 5, an example of methods of manufacturing the semiconductor device 10 will be explained. FIGS. 3 to 5 are diagrams for explaining an example of methods of manufacturing the semiconductor device 10 illustrated in FIG. 1.

First, as illustrated in FIG. 3, the semiconductor chip 14 is mounted to the chip mount surface 12a of the die pad 12 having one end part integrally joined to the lead 16. The semiconductor chip 14 can be mounted to the chip mount surface 12a by being bonded thereto with a lead-containing metal solder, for example.

In the next step, as illustrated in FIG. 4, the leads 18, 20 are arranged on both sides of the lead 16, and the end parts 18a, 20a of the leads 18, 20 are connected to the semiconductor chip 14 with the wires 28A, 28B, respectively. That is, the end parts 18a, 20a of the leads 18, are so-called wire-bonded to the semiconductor chip 14. In the subsequent step, as illustrated in FIG. 4, the end parts 18a, 20a of the leads 18, 20 are secured to the die pad 12 with a thermosetting resin such as an epoxy resin. This forms the thermosetting resin part 22. The thermosetting resin part 22 can be formed, for example, by transfer-molding the end parts 18a, 20a of the leads 18, 20 and one end part of the die pad 12 with a thermosetting resin. As explained with reference to FIGS. 1 and 2, the thermosetting resin part 22 can be formed such as to overlap an end part of the die pad 12.

In the subsequent step, the semiconductor chip 14, die pad 12, and thermosetting resin part 22 are sealed with a thermoplastic resin such as a PPS resin or liquid crystal polymer. This completes the semiconductor device 10 having the thermoplastic resin part 24 illustrated in FIG. 5. The sealing with the thermoplastic resin can be achieved by molding the shaped body illustrated in FIG. 4 with an injection molding machine, for example. In this case, as explained with reference to FIGS. 1 and 2, the thermoplastic resin part 24 can be formed with a predetermined width between the outer surface of the thermoplastic resin part 24 and that of the thermosetting resin part 22.

In the manufacturing method exemplified above, the bottom face 12f of the die pad 12 can be free of thermosetting and thermoplastic resins.

In the semiconductor device 10 packaged by the thermoplastic resin part 24 explained in the foregoing, the leads 18, 20 are secured to the die pad 12 with the thermosetting resin part 22 instead of thermoplastic resins. Therefore, even when locally heated by a soldering iron or the like at the time of connecting the semiconductor device 10 to other members such as circuit boards, for example, the leads 18, 20 are harder to drop out of the thermoplastic resin part 24 serving as the sealing part. In other words, the leads 18, 20 can stably be secured to the die pad 12.

When the semiconductor chip 14 is a MOS-FET, a power MOS-FET or the like utilizing SiC or GaN in particular, higher heat may occur upon driving the MOS-FET or the like. Even in such a case, the leads 18, 20 are secured to the die pad 12 with the thermosetting resin part 22 and thus are hard to drop out of the thermoplastic resin part 24. As a result, the leads 18, 20 can stably be secured to the die pad 12. Therefore, the structure of the semiconductor device 10 is effective in devices equipped with the semiconductor chip 14 such as a MOS-FET yielding a large amount of heat, a power MOS-FET or the like utilizing SiC or GaN in particular.

In one embodiment, the thermosetting resin part 22 overlaps an end part of the die pad 12, thereby more firmly joining with the die pad 12. This makes it harder for the leads 18, 20 to drop out of the region sealed with the resin.

In one embodiment, the thermosetting resin part 22 has an outer form smaller than that of the thermoplastic resin part 24, whereby the gap between the outer surface of the thermosetting resin part 22 and that of the thermoplastic resin part 24 is filled with the thermoplastic resin. This allows the thermosetting and thermoplastic resin parts 22, 24 to adhere to each other more closely, thereby making it harder for the thermosetting resin part 22 to drop out of the thermoplastic resin part 24.

The surface of the die pad 12 is substantially flat in the foregoing explanation. However, in one embodiment, a region covered with the thermosetting resin part in the end part on the end face side of the die pad may be formed with a depression or projection.

Figure 6:
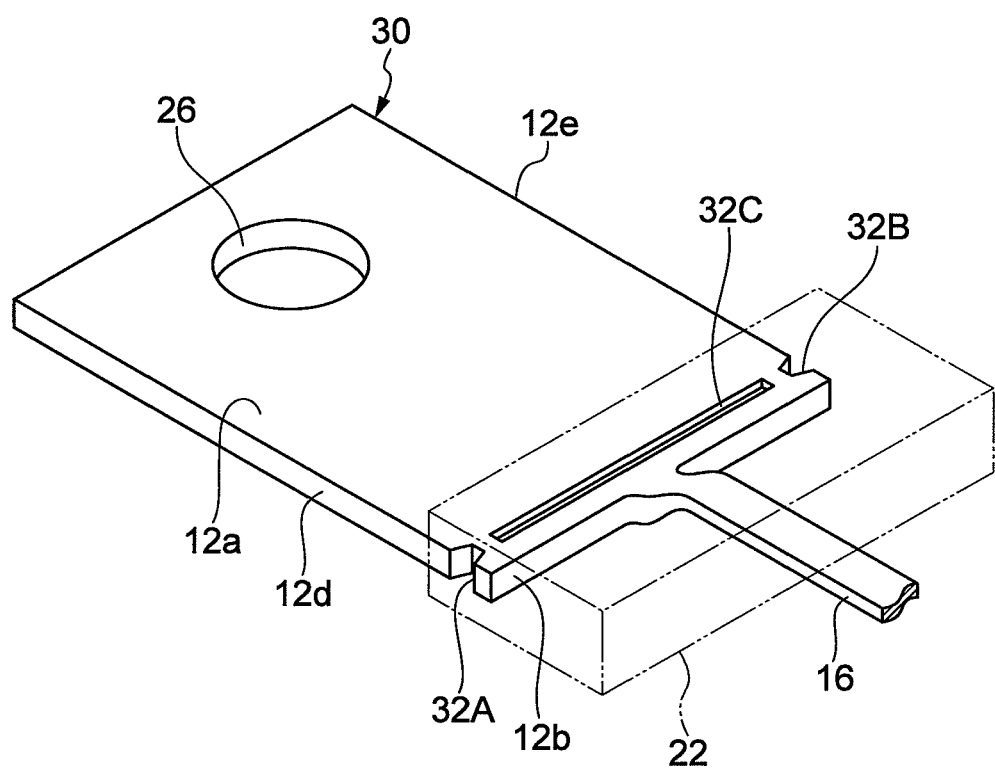
FIG. 6 is a perspective view of another example of the die pad included in the semiconductor device of FIG. 1.

FIG. 6 is a perspective view of another embodiment of the die pad. For convenience of explanation, FIG. 6 illustrates the outer form of the thermosetting resin part 22 with dash-double-dot lines. FIG. 6 also depicts the lead 16. In the die pad 30 illustrated in FIG. 6, depressions 32A, 32B are formed on the side faces 12d, 12e, respectively, while a depression 32C extending from the side face 12d side to the side face 12e side is formed on the chip mount surface 12a. Examples of forms of the depressions 32A, 32B, 32C include wedges.

Thus forming the depressions 32A, 32B, 32C makes the thermosetting resin part 22 easier to bite into and more stably securable to the end part on the side face 12b side of the die pad 30. As a result, the thermosetting resin part 22 and die pad 30 are joined to each other more firmly.

Projections may be formed in place of the depressions 32A, 32B, 32C illustrated in FIG. 6. Examples of the projections include those having a triangular cross section. Irregularities constituted by depressions and projections may also be formed instead of the depressions 32A, 32B, 32C. Examples of the irregularities include saw-toothed ones. FIG. 6 illustrates a mode in which the depressions 32A, 32B, 32C are formed on the side faces 12d, 12e and the chip mount surface 12a, respectively. However, it will be sufficient if a depression is formed in a part of a region covered with the thermosetting resin part 22 in the end part of the die pad 30. For example, a depression may be formed in one of the side faces 12d, 12e and chip mount surface 12a alone. The same also holds in the case where projections or irregularities constituted by depressions and projections are formed in place of the depressions as mentioned above.

Figure 7:
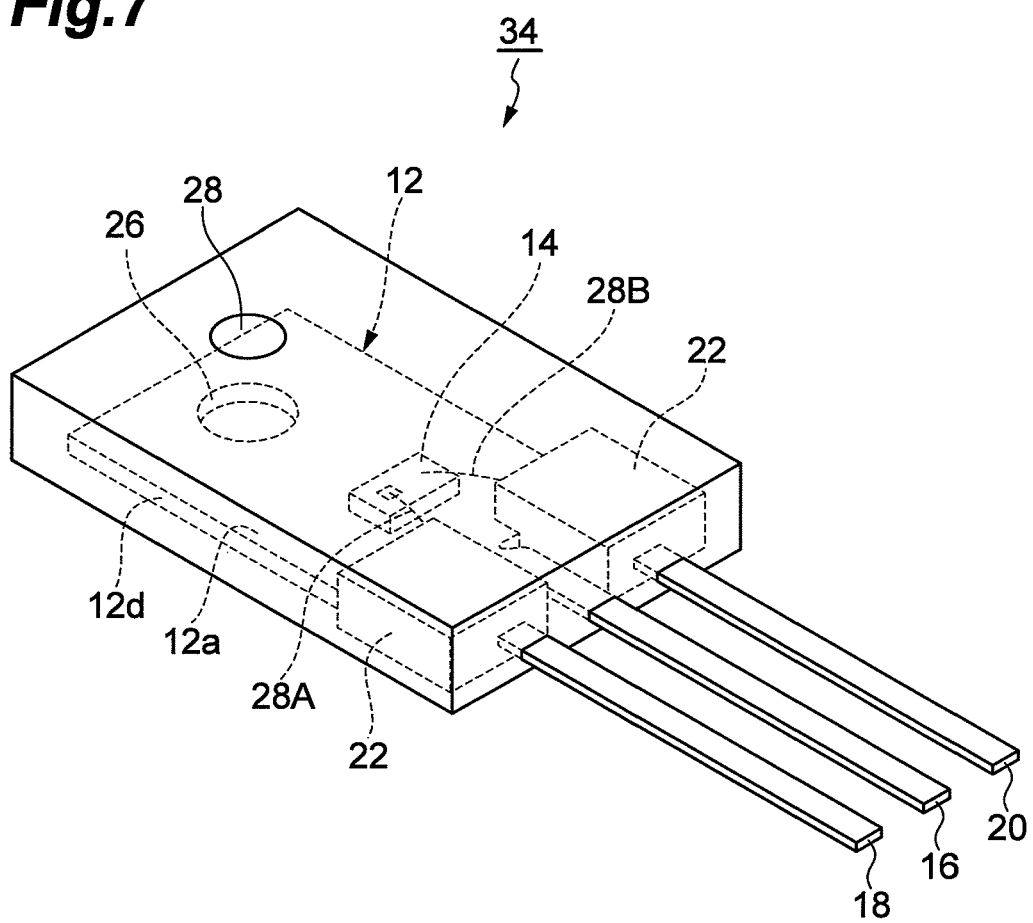
FIG. 7 is a perspective view of the semiconductor device in accordance with another embodiment of the present invention.
Figure 8:
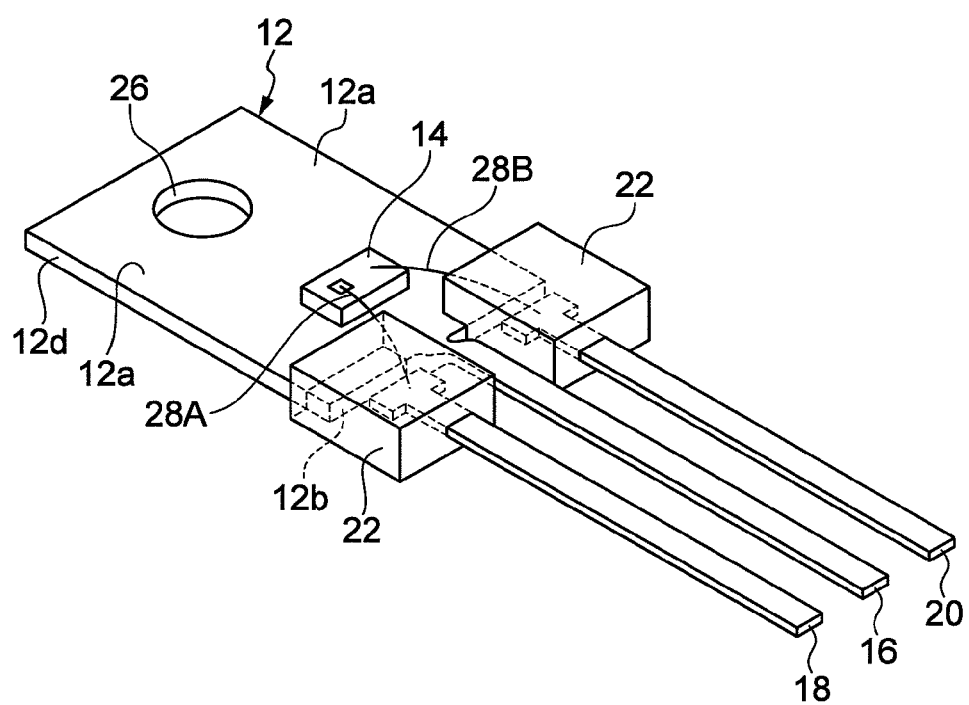
FIG. 8 is a diagram illustrating a state before forming a thermoplastic resin part in the semiconductor device represented in FIG. 7.

In the structure of the semiconductor device 10, the thermosetting resin part 22 covers the whole end part of the die pad 12 from the side face 12d to the side face 12e. As illustrated in FIGS. 7 and 8, however, it will be sufficient if respective thermosetting resin parts 22 are provided so as to correspond to the end parts 18a, 20a of the leads 18, 20. FIG. 7 is a perspective view of the semiconductor device in accordance with another embodiment of the present invention. FIG. 8 is a diagram illustrating a state before molding with a thermoplastic resin in the semiconductor device represented in FIG. 7.

As illustrated in FIGS. 7 and 8, this semiconductor device 34 structurally differs from the semiconductor device 10 in that the thermosetting resin parts 22 do not cover the joining part between the die pad 12 and lead 16. Except for this point, the semiconductor device 34 has the same structure as with the semiconductor device 10. The semiconductor device 34 can be manufactured by molding the semiconductor chip 14, die pad 12, and thermosetting resin parts 22, 22 illustrated in FIG. 8 with a thermoplastic resin.

The semiconductor device 34 yields operations and effects similar to those of the semiconductor device 10, since the end parts 18a, 20a of the leads 18, 20 are secured to the die pad 12 with a thermosetting resin. The semiconductor device 34 may employ the die pad 30 formed with depressions, projections, or irregularities constituted by depressions and projections as explained with reference to FIG. 6.

Though a variety of embodiments of the present invention have been explained in the foregoing, the present invention can be modified in various ways within the scope not deviating from the gist thereof without being restricted by the embodiments illustrated above.

For example, it has been explained that each of the die pads 12, is provided with the leads 18, 20 as the first leads and the lead 16 as the second lead. However, the second lead may be omitted depending on the structure of the semiconductor chip 14. The number of first leads may be 1 or 3 or more without being restricted to 2. The present invention is also applicable to semiconductor devices such as analog IC, digital IC, CPU, and memories.

What is claimed is:

1. A semiconductor device comprising:
a semiconductor chip;
a die pad having a chip mount surface for mounting the semiconductor chip, wherein the die pad has a first end and a second end;
a first lead having an end part electrically connected to the semiconductor chip;
a thermosetting resin part for securing the end part of the first lead to the first end of the die pad; and
a thermoplastic resin part for sealing the semiconductor chip, the die pad, and the thermosetting resin part,
wherein the thermosetting resin part overlaps a part of at least one of the chip mount surface and side faces of the die pad, the part being adjacent to the first lead,
wherein the die pad and the first lead are separate members,
wherein the thermosetting resin part is partially covering the die pad such that the second end of the die pad is free from the thermosetting resin part.

2. A semiconductor device according to claim 1, further comprising a second lead integrally joined to the die pad.

3. A semiconductor device according to claim 1, wherein a surface of the die pad opposite to the chip mount surface is free of the thermosetting and thermoplastic resin parts.

4. A semiconductor device according to claim 1, wherein the thermoplastic resin part covers the thermosetting resin part.

5. A semiconductor device according to claim 4, wherein the part of the die pad overlapping the thermosetting resin part is formed with at least one of a depression and a projection.

6. A semiconductor device according to claim 5, wherein a cross-sectional shape of the depression or projection is at least one of rectangular, wedge-shaped, or triangular.

7. A semiconductor device according to claim 5, wherein the depression or projection is formed on a side face of the die pad.

8. A semiconductor device according to claim 5, wherein the depression or projection is formed on the chip mount surface and extends from one side face of the die pad to an opposing side face of the die pad.

9. A semiconductor device according to claim 1, wherein the part of the die pad overlapping the thermosetting resin part is formed with at least one of a depression and a projection.

10. A semiconductor device according to claim 9, wherein a cross-sectional shape of the depression or projection is at least one of rectangular, wedge-shaped, or triangular.

11. A semiconductor device according to claim 9, wherein the depression or projection is formed on a side face of the die pad.

12. A semiconductor device according to claim 9, wherein the depression or projection is formed on the chip mount surface and extends from one side face of the die pad to an opposing side face of the die pad.

13. A method of manufacturing a semiconductor device, the method comprising the steps of:
mounting a semiconductor chip to a chip mount surface of a die pad, wherein the die pad has a first end and a second end;
electrically connecting the semiconductor chip and an end part of a first lead to each other;
securing the end part of the first lead to the first end of the die pad with a thermosetting resin; and
sealing the thermosetting resin, the semiconductor chip, and the die pad with a thermoplastic resin,
wherein the thermosetting resin part overlaps a part of at least one of the chip mount surface and side faces of the die pad, the part being adjacent to the first lead,
wherein the die pad and the first lead are separate members,
wherein the thermosetting resin part is partially covering the die pad such that the second end of the die pad is free from the thermosetting resin part.

* * * * *